(12) United States Patent
Chen et al.

(10) Patent No.: US 11,896,125 B2
(45) Date of Patent: Feb. 13, 2024

(54) SLIDE RAIL ASSEMBLY AND BRACKET DEVICE THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Chi-Chih Chou, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 823 days.

(21) Appl. No.: 16/823,433

(22) Filed: Mar. 19, 2020

(65) Prior Publication Data

US 2021/0161294 A1    Jun. 3, 2021

(30) Foreign Application Priority Data

Dec. 2, 2019   (TW) ................................ 108144211

(51) Int. Cl.
| | |
|---|---|
| *A47B 88/43* | (2017.01) |
| *H05K 7/18* | (2006.01) |
| *A47B 96/07* | (2006.01) |
| *H05K 7/14* | (2006.01) |

(52) U.S. Cl.
CPC .............. *A47B 88/43* (2017.01); *A47B 96/07* (2013.01); *H05K 7/1489* (2013.01); *H05K 7/183* (2013.01)

(58) Field of Classification Search
CPC ...... A47B 88/43; A47B 96/07; H05K 7/1489; H05K 7/183
USPC ......... 312/334.4, 334.5, 223.1, 265.1, 265.2, 312/265.3, 265.4
See application file for complete search history.

(56) References Cited

U.S. PATENT DOCUMENTS

| | | | |
|---|---|---|---|
| 6,935,711 B1 * | 8/2005 | Naue ....................... | A47B 88/43 312/334.4 |
| 9,392,721 B2 | 7/2016 | Hsu et al. | |
| 9,801,467 B2 | 10/2017 | Chen et al. | |
| 9,930,805 B2 | 3/2018 | Chen et al. | |
| 10,104,799 B2 * | 10/2018 | Shearman ............ | H05K 7/1489 |
| 2005/0189855 A1 * | 9/2005 | Naue ....................... | A47B 88/43 312/334.4 |
| 2008/0230496 A1 * | 9/2008 | Henderson ........... | H05K 7/1489 211/26 |

(Continued)

FOREIGN PATENT DOCUMENTS

| | | |
|---|---|---|
| EP | 2547187 A2 | 1/2013 |
| JP | 2017136352 A | 8/2017 |

*Primary Examiner* — Kimberly T Wood
(74) *Attorney, Agent, or Firm* — Best & Flanagan LLP

(57) ABSTRACT

A bracket device of a slide rail assembly includes a longitudinal wall and a mounting member. The mounting member is movable relative to the longitudinal wall along a height direction of the longitudinal wall. When the bracket device is rotated to be switched from a first state to a second state, the mounting member is configured to be moved from a first position to a second position. When the mounting member is located at the first position, the mounting member is operable to be mounted to a rack. When the mounting member is located at the second position, the mounting member is prevented from being mounted to the rack.

7 Claims, 8 Drawing Sheets

(56) References Cited

U.S. PATENT DOCUMENTS

| | | | |
|---|---|---|---|
| 2012/0018605 A1* | 1/2012 | Lacarra | A47B 88/43 211/163 |
| 2014/0363108 A1* | 12/2014 | Chen | A47B 88/43 384/22 |
| 2016/0157610 A1* | 6/2016 | Chen | A47B 88/43 248/219.3 |

* cited by examiner

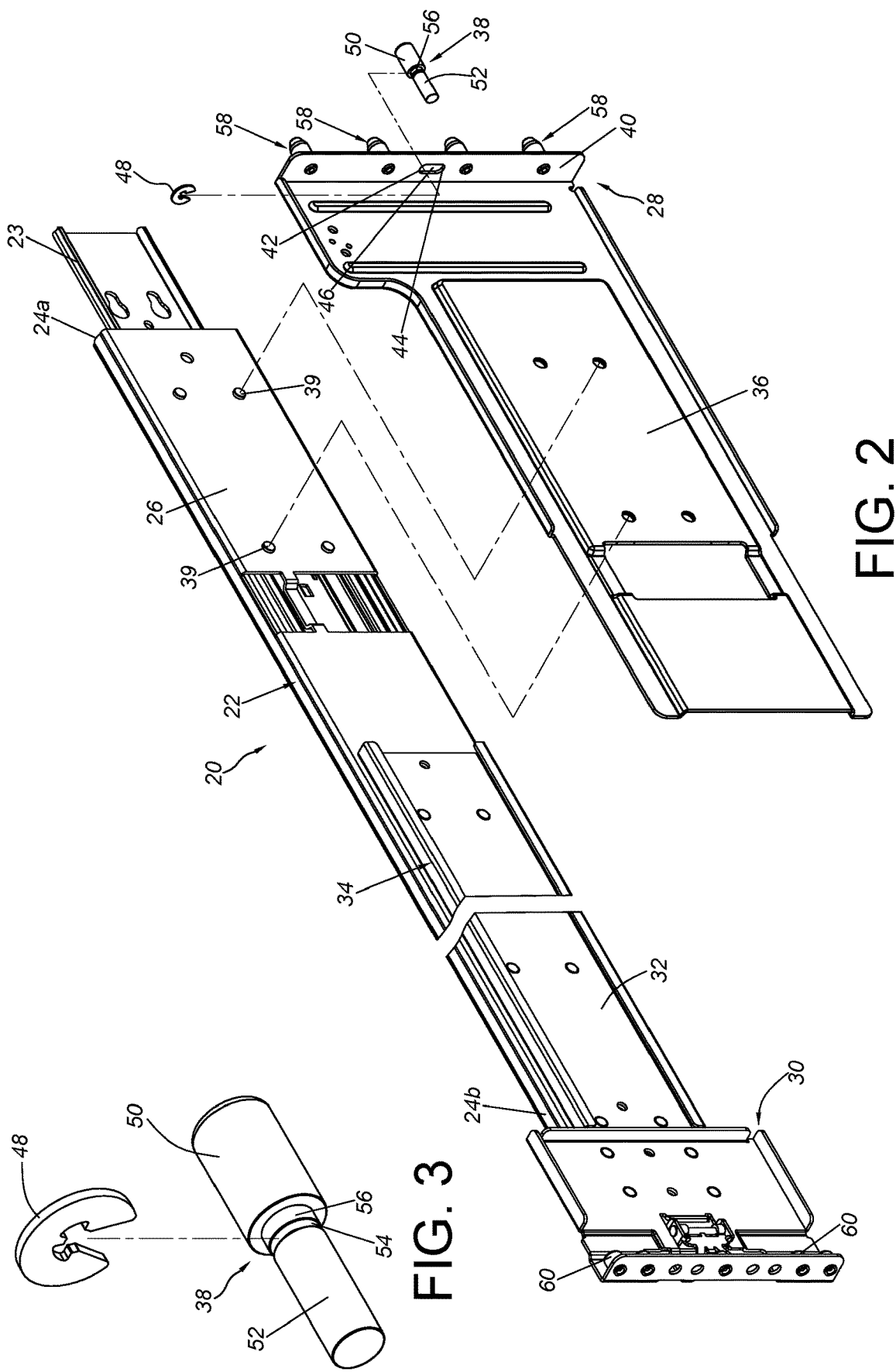

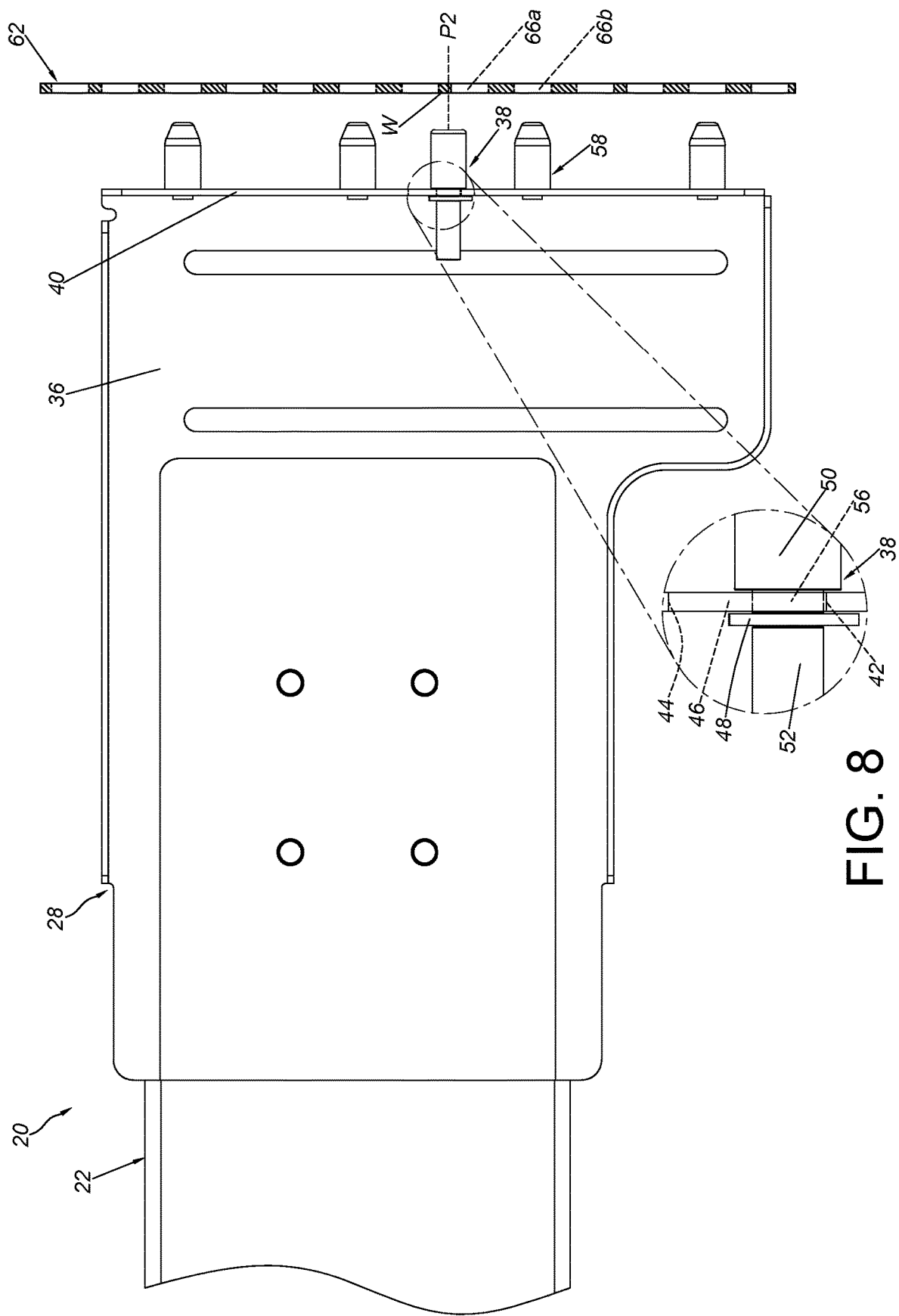

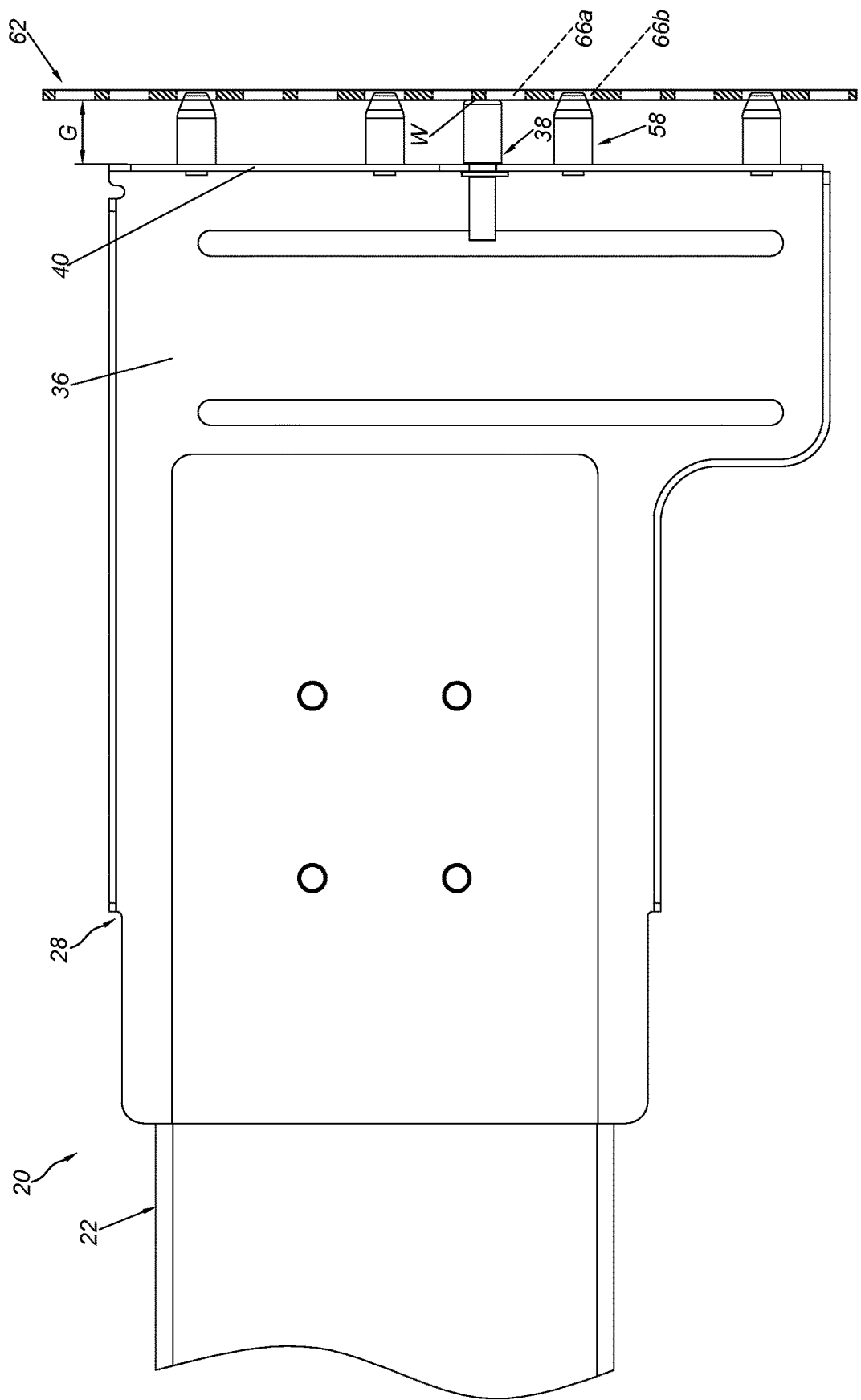

SLIDE RAIL ASSEMBLY AND BRACKET DEVICE THEREOF

BACKGROUND OF THE INVENTION

1. Field of the Invention

The present invention relates to a bracket device, and more particularly, to a bracket device applicable to a slide rail assembly.

2. Description of the Prior Art

Generally, a bracket device is applicable to a slide rail assembly, such that the slide rail assembly can be mounted to a post of a rack through the bracket device.

U.S. Pat. No. 9,930,805 B2 discloses a bracket and a foolproof device thereof. The foolproof device comprises a sliding block and a positioning member. As shown in FIG. 4 and FIG. 5 of the patent, when a mounting base of the bracket is rotated 180 degrees, the positioning member falls into an engagement feature of the sliding block due to gravity, such that the sliding block is not movable relative to the mounting base. When the bracket is placed at a first mounting angle relative to a post, the bracket is not interfered by the foolproof device and is able to be mounted to a rack. When the bracket is placed at a second mounting angle relative to the post, the sliding block of the foolproof device is not movable relative to the mounting base, such that the bracket is blocked by the foolproof device to be prevented from being mounted to the rack. However, the sliding block of the patent is not configured to be mounted to a mounting hole of the post.

U.S. Pat. No. 9,801,467 B2 discloses a bracket device including a bracket, at least one mounting member, a locking member, and a fool-proofing member. The at least one mounting member is mounted on the bracket. The locking member is movable with respect to the bracket. The fool-proofing member is located at a first position or a second position with respect to the bracket. When the bracket is at a first mounting angle, the fool-proofing member is located at the first position and is unable to block the locking member from moving with respect to the bracket. When the bracket is flipped from the first mounting angle to a second mounting angle, the fool-proofing member is displaced from the first position to the second position and ends up blocking the moving path of the locking member with respect to the bracket. However, in this patent, a foolproof function cannot be achieved without the locking member.

Therefore, for different market requirements, it is important to develop various products with a foolproof function.

SUMMARY OF THE INVENTION

The present invention provides a bracket device of a slide rail assembly with a foolproof function.

According to an embodiment of the present invention, a bracket device comprises a longitudinal wall and a mounting member. The mounting member is movable relative to the longitudinal wall along a height direction of the longitudinal wall to be located at one of a first position and a second position. When the bracket device is rotated a predetermined angle to be switched from a first state to a second state, the mounting member is configured to be moved from the first position to the second position.

Preferably, the predetermined angle is substantially 180 degrees.

Preferably, when the bracket device is in the first state, the mounting member is located at the first position and is configured to be mounted to a post.

Preferably, when the bracket device is in the second state, the mounting member is located at the second position and is prevented from being mounted to the post.

Preferably, the bracket device further comprises a connecting member fixed relative to the longitudinal wall. When the bracket device is in the first state, the mounting member is located at the first position and configured to be mounted to a first mounting hole of the post, and the connecting member is configured to be mounted to a second mounting hole of the post.

Preferably, the bracket device further comprises an extension wall connected to the longitudinal wall. The mounting member is movable relative to the longitudinal wall along the height direction through the extension wall.

Preferably, the extension wall is substantially perpendicularly connected to the longitudinal wall. The extension wall comprises a first part and a second part. A path is defined between the first part and the second part, and the path is arranged along the height direction.

Preferably, the path is an elongated hole.

Preferably, the mounting member is configured to pass through a portion of the elongated hole. The mounting member comprises a first feature and a second feature respectively located at a front side and a rear side of the extension wall.

Preferably, the height direction is substantially perpendicular to a longitudinal direction of the longitudinal wall.

According to another embodiment of the present invention, a slide rail assembly comprises a rail member. The rail member has a first end part, a second end part and a longitudinal body arranged between the first end part and the second end part. The rail member is arranged with a first bracket device and a second bracket device respectively adjacent to the first end part and the second end part. The first bracket device comprises a longitudinal wall and a mounting member. The mounting member is movable relative to the longitudinal wall along a height direction of the longitudinal wall to be located at one of a first position and a second position.

Preferably, when the mounting member of the first bracket device is located at the first position, the mounting member of the first bracket device is configured to be mounted to a first post of a rack, and the second bracket device is configured to be mounted to a second post of the rack.

Preferably, when the mounting member of the first bracket device is located at the second position, the mounting member of the first bracket device is prevented from being mounted to the first post.

Preferably, the first bracket device further comprises an extension wall connected to the longitudinal wall, and the mounting member is movable relative to the longitudinal wall along the height direction through the extension wall.

Preferably, the extension wall of the first bracket device is substantially perpendicularly connected to the longitudinal wall.

Preferably, the extension wall comprises a first part and a second part. A path is defined between the first part and the second part, and the path is arranged along the height direction.

Preferably, the path is an elongated hole.

Preferably, the mounting member is configured to pass through a portion of the elongated hole, and the mounting member comprises a first feature and a second feature respectively located at a front side and a rear side of the extension wall.

Preferably, a middle part is arranged between the first feature and the second feature, and the middle part is located a corresponding position between the first part and the second part.

Preferably, the slide assembly comprises a movable rail longitudinally movable relative the rail member.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is an exploded view of the slide rail assembly and a first bracket device according to an embodiment of the present invention;

FIG. 3 is an exploded view of a mounting member of the first bracket device according to an embodiment of the present invention;

FIG. 8 is a diagram showing the slide rail assembly in the second state and unable to be mounted to the post of the rack according to an embodiment of the present invention; and FIG. 9 is a diagram showing the slide rail assembly in the second state being prevented from being mounted to the post of the rack according to an embodiment of the present invention.

DETAILED DESCRIPTION

Figure 1:
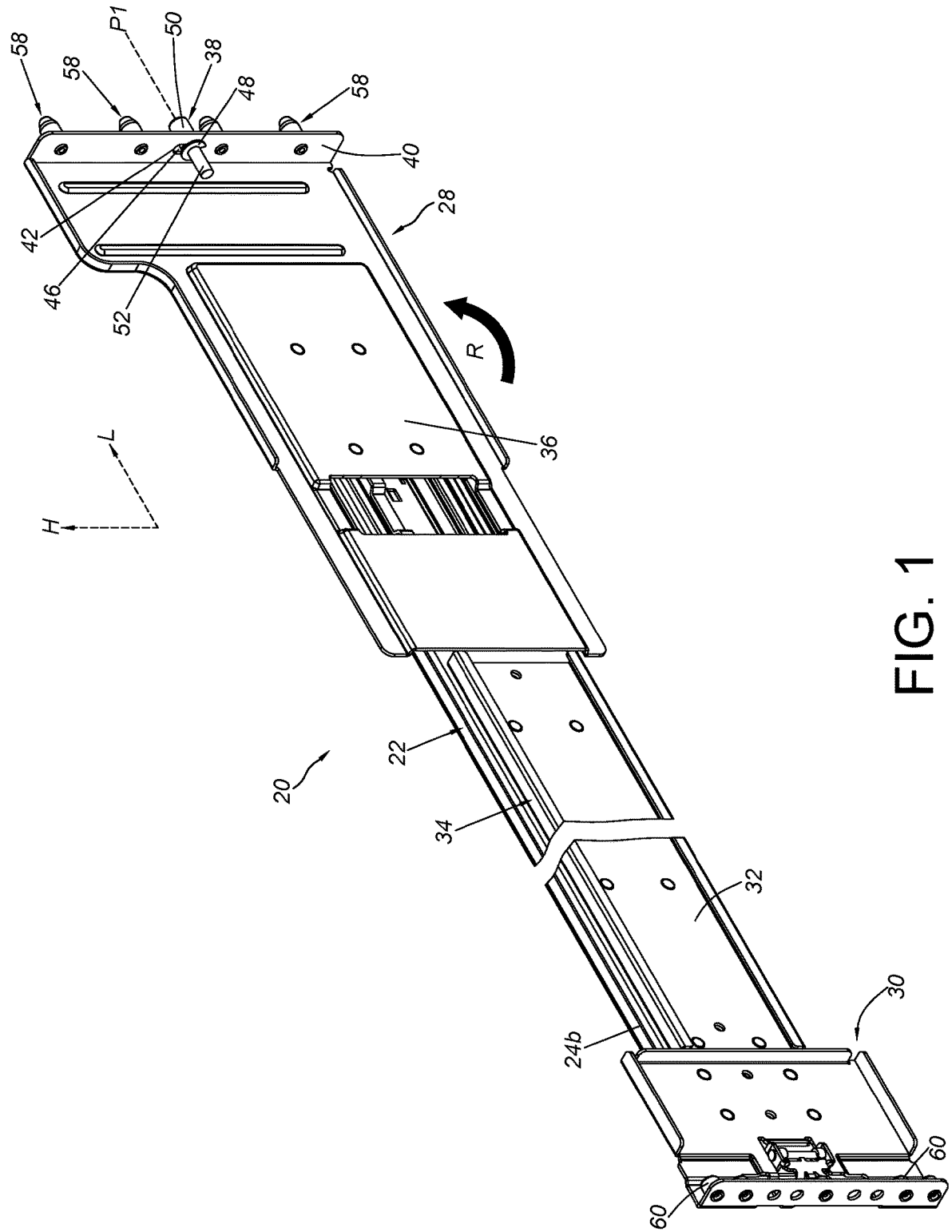
FIG. 1 is a diagram showing a slide rail assembly being in a first state according to an embodiment of the present invention.

As shown in FIG. 1 and FIG. 2, a slide rail assembly 20 comprises a rail member 22 according to an embodiment of the present invention. Preferably, the slide rail assembly 20 further comprises a movable rail 23 retractably connected to the rail member 22 and longitudinally movable relative to the rail member 22. The rail member 22 has a first end part 24a, a second end part 24b and a longitudinal body 26 arranged between the first end part 24a and the second end part 24b. The rail member 22 is arranged with a first bracket device 28 adjacent to the first end part 24a, and a second bracket device 30 adjacent to the second end part 24b.

Preferably, the rail member 22 is arranged with a reinforcing member 34 configured to enhance structural strength of the rail member 22, and the second bracket device 30 is connected to the rail member 22 and adjacent to the reinforcing member 34. On the other hand, the first bracket device 28 is connected to the rail member 22. The first bracket device 28 comprises a longitudinal wall 36 and a mounting member 38. The longitudinal wall 36 is configured to be connected to the rail member 22 through fixing features 39. In addition, the first bracket device 28 further comprises an extension wall 40 connected to the longitudinal wall 36. In the present embodiment, the extension wall 40 is substantially perpendicularly connected to the longitudinal wall 36, but the present invention is not limited thereto.

The mounting member 38 is movable relative to the longitudinal wall 36 along a height direction H of the longitudinal wall 36. The height direction H is substantially perpendicular to a longitudinal direction L of the longitudinal wall 36 (or a longitudinal direction of the rail member 22).

Preferably, the mounting member 38 is movable relative to the longitudinal wall 36 along the height direction H through the extension wall 40. Moreover, the extension wall 40 comprises a first part 42 and a second part 44. A path 46 is defined between the first part 42 and the second part 44, and the path 46 is arranged along the height direction H. In the present embodiment, the path 46 is an elongated hole, but the present invention is not limited thereto. The mounting member 38 is configured to pass through a portion of the elongated hole. The mounting member 38 comprises a first feature 48 and a second feature 50 (please also refer to FIG. 3) respectively located at a front side and a rear side of the extension wall 40. Both transverse dimensions of the first feature 48 and the second feature 50 of the mounting member 38 are greater than a transverse dimension of the path 46 of the extension wall 40, in order to prevent the mounting member 38 from being moved relative to the extension wall 40 along the longitudinal direction L (such as forward or backward).

Preferably, the mounting member 38 has an extension section 52 extended from the second feature 50, and the extension section 52 has a mounting structure 54 (as shown in FIG. 3). The mounting structure 54 can be a groove, but the present invention is not limited thereto. The first feature 48 can be a fastening ring, but the present invention is not limited thereto. The fastening ring is configured to engage with the mounting structure 54. A middle part 56 is located between the first feature 48 and the second feature 50. The middle part 56 of the mounting member 38 passes through a portion of the path 46 (such as the elongated hole) of the extension wall 40 to be located a corresponding position between the first part 42 and the second part 44.

Preferably, the first bracket device 28 further comprises at least one connecting member 58 fixed relative to the longitudinal wall 36. In the present embodiment, the extension wall 40 of the first bracket device 28 is arranged with a plurality of connecting members 58, and the plurality of the connecting members 58 and the mounting member 38 are arranged on the extension wall 40 along the height direction H. On the other hand, the second bracket device 30 comprises at least one connecting feature 60. In the present embodiment, the second bracket device 30 comprises a plurality of connecting features 60, and the plurality of connecting features 60 are arranged on the second bracket device 30 along the height direction H.

Figure 4:
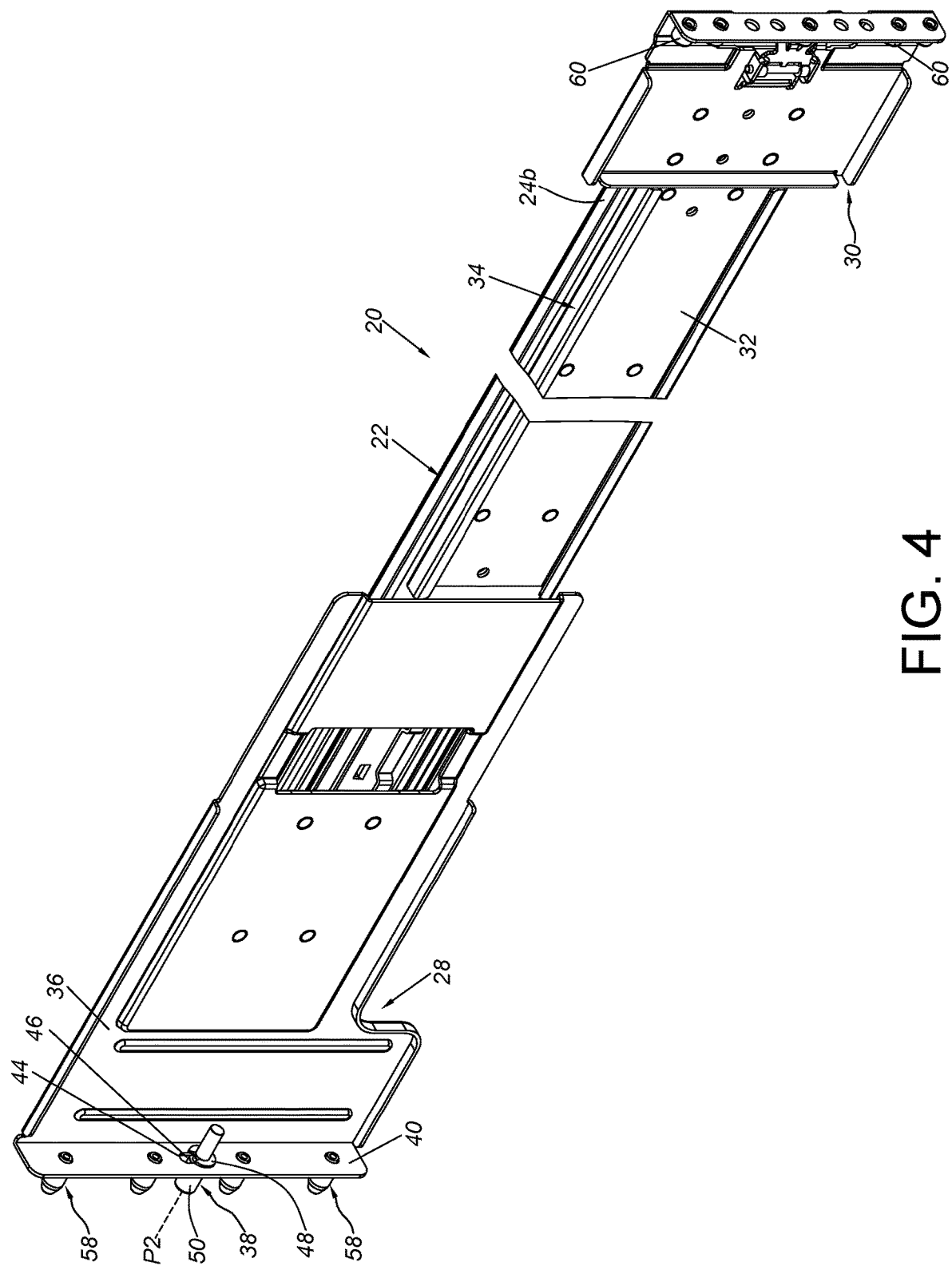
FIG. 4 is a diagram showing the slide rail assembly being in a second state according to an embodiment of the present invention.

As shown in FIG. 1 and FIG. 4, when the slide rail assembly 20 (the first bracket device 28) is rotated a predetermined angle R to be switched from a first state (as shown in FIG. 1) to a second state (as shown in FIG. 4), the mounting member 38 is configured to be moved from a first position P1 (as shown in FIG. 1) to a second position P2 (as shown in FIG. 4). For example, the mounting member 38 can be moved from the first position P1 to the second position P2 by gravity. Preferably, the predetermined angle R is substantially 180 degrees. (That is, the slide rail assembly 20 in the first state shown in FIG. 1 is flipped upside-down to become the slide rail assembly 20 in the second state shown in FIG. 4.)

Figure 5:
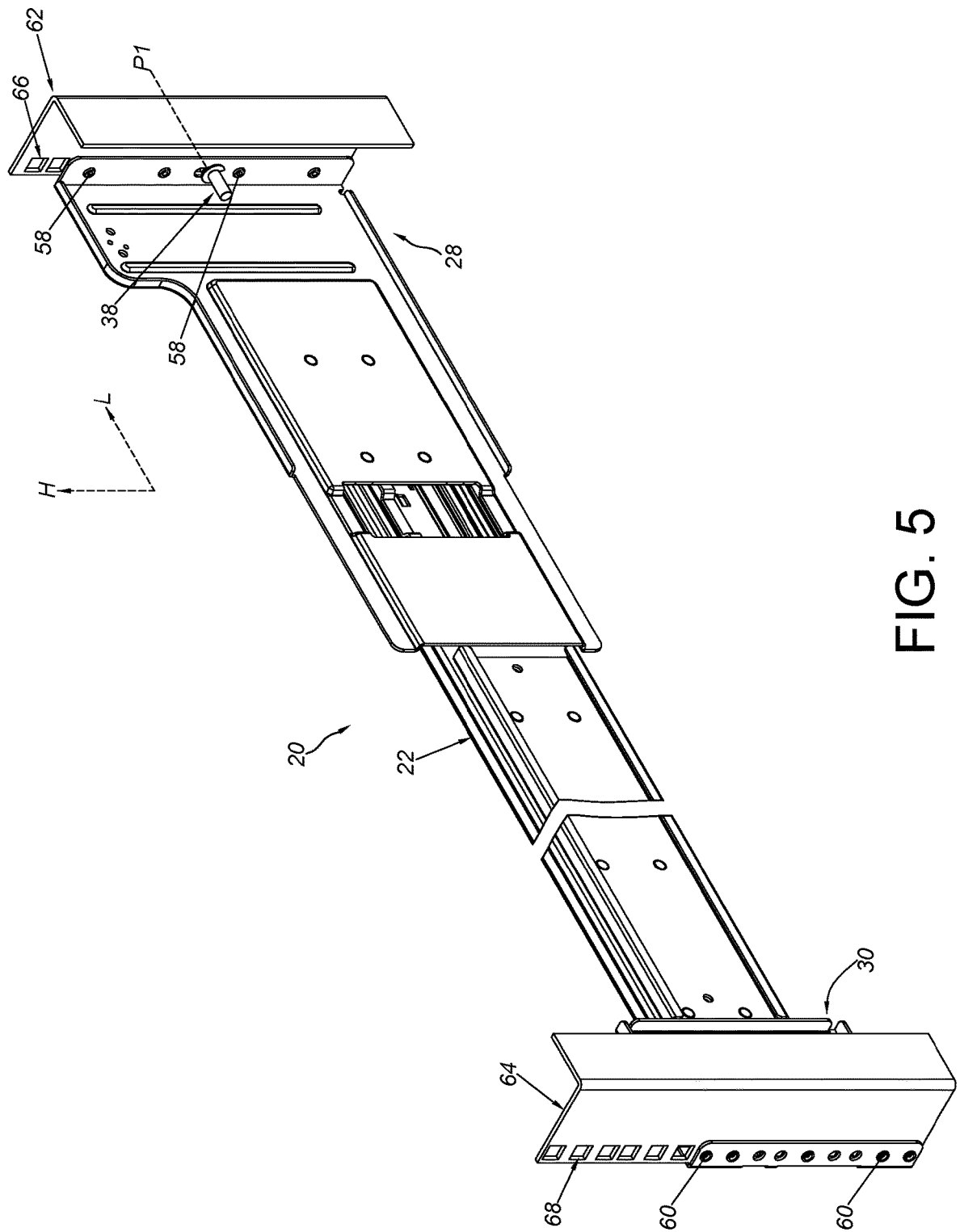
FIG. 5 is a diagram showing the slide rail assembly in the first state being configured to be mounted to a rack according to an embodiment of the present invention.

As shown in FIG. 5, the slide rail assembly 20 is applicable to a first post 62 and a second post 64 of a rack. The first post 62 has a plurality of mounting holes 66 arranged along the height direction H. Similarly, the second post 64 has a plurality of connecting holes 68 arranged along the height direction H. Preferably, the rack can be a cabinet complying with a specification defined by the Electronic Industries Association (EIA) or the Open Compute Project (OCP). Furthermore, when the slide rail assembly 20 (or the first bracket device 28) is in the first state, the mounting member 38 of the first bracket device 28 is located at the first position P1 and configured to be mounted to one of the mounting holes 66 of the first post 62, and the connecting member 58 of the first bracket device 28 is configured to be mounted to another mounting hole 66 of the first post 62. On the other hand, the connecting feature 60 of the second bracket device 30 is configured to be mounted to the connecting hole 68 of the second post 64.

Figure 6:
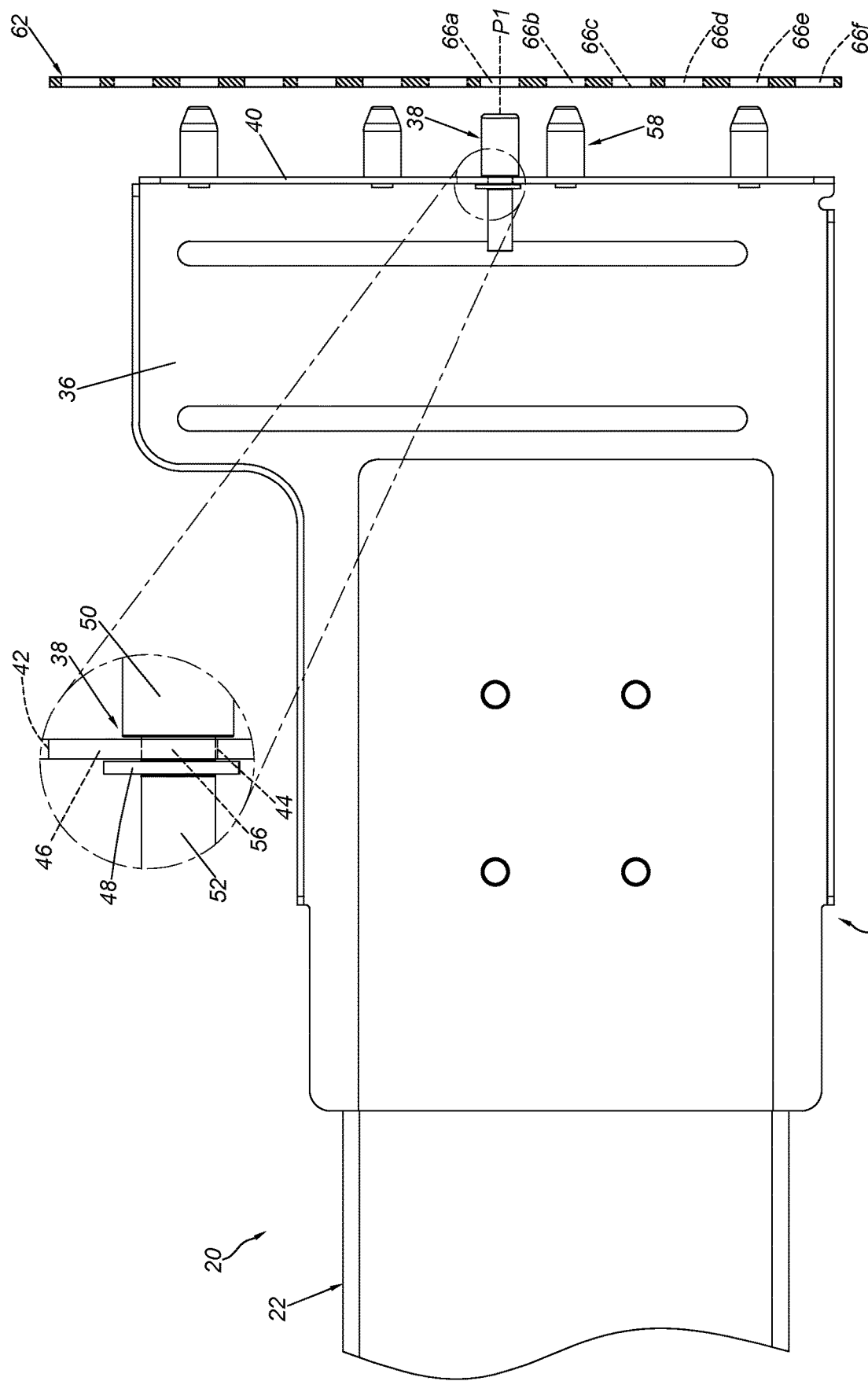
FIG. 6 is a diagram showing the slide rail assembly in the first state before being mounted to a post of the rack according to an embodiment of the present invention.

As shown in FIG. 6, the cabinet can comply with the specification defined by the Electronic Industries Association (EIA) or the Open Compute Project (OCP). In the present embodiment, the cabinet complies with the specification defined by EIA. Each three mounting holes among the plurality of mounting holes of the first post 62 are defined as a rack unit, that is, 1U. (Two rack units are called 2U, and so on.) A first standard spacing is defined between two adjacent mounting holes in each rack unit, and a second standard spacing is defined between each two adjacent rack units.

For example, a first rack unit comprises a first mounting hole 66a, a second mounting hole 66b and a third mounting hole 66c; and a second rack unit comprises a fourth mounting hole 66d, a fifth mounting hole 66e and a sixth mounting hole 66f. The first standard spacing is defined between the first mounting hole 66a and the second mounting hole 66b (and between the second mounting hole 66b and the third mounting hole 66c). The second standard spacing is defined between the third mounting hole 66c and the fourth mounting hole 66d.

Figure 7:
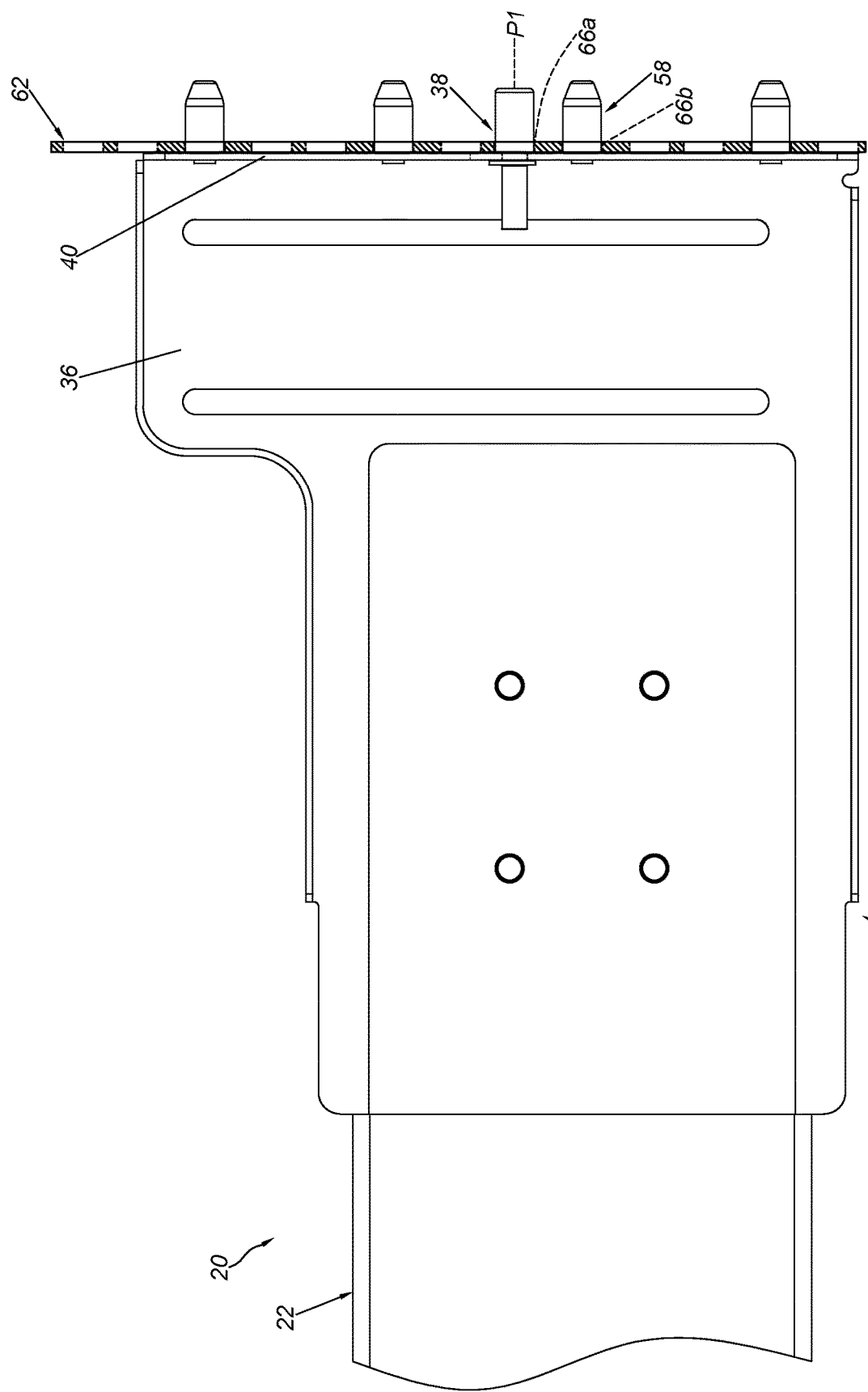
FIG. 7 is a diagram showing the slide rail assembly in the first state after being mounted to the post of the rack according to an embodiment of the present invention.

As shown in FIG. 6 and FIG. 7, when the slide rail assembly 20 (or the first bracket device 28) is in the first state, the mounting member 38 of the first bracket device 28 is located at the first position P1 to be aligned with the first mounting hole 66a of the first post 62 for mounting into the first mounting hole 66a, and the connecting member 58 of the first bracket device 28 is configured to be mounted to the second mounting hole 66b of the first post 62. When the slide rail assembly 20 (or the first bracket device 28) is in the first state, the mounting member 38 is located at the first position P1, and the mounting member 38 can be supported by the second part 44 in the path 46 through the middle part 56 (as shown in FIG. 6).

As shown in FIG. 8 and FIG. 9, when the slide rail assembly 20 (or the first bracket device 28) is in the second state, the mounting member 38 of the first bracket device 28 is located at the second position P2 and prevented from being mounted to the first mounting hole 66a of the first post 62. Specifically, when the mounting member 38 of the first bracket device 28 is located at the second position P2, the mounting member 38 is not aligned with the first mounting hole 66a of the first post 62, and the mounting member 38 is configured to contact (such as abut against) a wall surface W of the first post 62 (that is, the mounting member 38 contacts the wall surface W on the first standard spacing between two adjacent mounting holes of the first post 62) to cause interference. Accordingly, a gap G (as shown in FIG. 9) is formed between the first bracket device 28 (or the extension wall 40 of the first bracket device 28) and the first post 62 (or the wall surface W of the first post 62), such that the mounting member 38 cannot be mounted to the first mounting hole 66a of the first post 62. On the other hand, since the mounting member 38 contacts the wall surface W of the first post 62 to cause the interference, the connecting member 58 of the first bracket device 28 cannot be mounted to the second mounting hole 66b of the first post 62. When the slide rail assembly 20 (or the first bracket device 28) is in the second state, the mounting member 38 is located at the second position P2, and the mounting member 38 is supported by the first part 42 in the path 46 through the middle part 56 (as shown in FIG. 8).

In other words, for the specification of EIA or OCP, a plurality of holes specified by the EIA or OCP can only allow the plurality of connecting members arranged at predetermined intervals to insert therein. Once the interval between each two adjacent connecting members does not match the spacing between two adjacent holes specified by EIA or OCP, the plurality of connecting members on the bracket cannot be mounted to the holes specified by EIC or OCP.

Therefore, the first bracket device 28 of the slide rail assembly 20 according to the embodiments of the present invention is characterized in that:

1. The first bracket device 28 can provide a foolproof function by using the movement of the mounting member 38 along the height direction H. In contrast to the prior art, the first bracket device 28 according to the embodiments of the present invention has a simpler structure for a foolproof mechanism. In addition to foolproof function, the mounting member 38 also provides mounting and supporting functions.
2. The mounting member 38 of the first bracket device 28 is configured to be located at the first position P1 or the second position P2. When the mounting member 38 is located at the first position P1, the mounting member 38 is configured to be mounted to the mounting hole 66 of the first post 62; or when the mounting member 38 is located at the second position P2, the mounting member 38 is prevented from being mounted to the mount hole 66 of the first post 62.
3. When the slide rail assembly 20 (or the first bracket device 28) is in the second state, the mounting member 38 of the first bracket device 28 is located at the second position P2 and configured to contact the wall surface W of the first post 62 to cause interference. Accordingly, the mounting member 38 of the first bracket device 28 cannot be mounted to the mounting hole 66 of the first post 62, such that the first bracket device 28 can provide a foolproof effect. According to such arrangement, the slide rail assembly 20 (or the first bracket device 28) can be prevented from being mounted to the rack having posts at left and right sides incorrectly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bracket device, comprising:
   a longitudinal wall;
   a mounting member movable relative to the longitudinal wall along a height direction of the longitudinal wall to be located at one of a first position and a second position; and
   a connecting member fixed relative to the longitudinal wall;
   wherein when the bracket device is rotated a predetermined angle to be switched from a first state to a second state, the mounting member is configured to be freely moved from the first position to the second position by gravity;
   wherein when the bracket device is in the first state, the mounting member is located at the first position and configured to be mounted to a first mounting hole of a post, and the connecting member is configured to be mounted to a second mounting hole of the post.

2. The bracket device of claim 1, wherein the predetermined angle is substantially 180 degrees.

3. The bracket device of claim 1, wherein the height direction is substantially perpendicular to a longitudinal direction of the longitudinal wall.

4. The bracket device of claim 1, further comprising an extension wall connected to the longitudinal wall; wherein the mounting member is movable relative to the longitudinal wall along the height direction through the extension wall.

5. The bracket device of claim 4, wherein the extension wall is substantially perpendicularly connected to the longitudinal wall; wherein the extension wall comprises a first part and a second part, a path is defined between the first part and the second part, and the path is arranged along the height direction.

6. The bracket device of claim 5, wherein the path is an elongated hole.

7. The bracket device of claim 6, wherein the mounting member is configured to pass through a portion of the elongated hole, and the mounting member comprises a first feature and a second feature respectively located at a front side and a rear side of the extension wall.

* * * * *